United States Patent
Oh et al.

(10) Patent No.: US 9,859,358 B2
(45) Date of Patent: Jan. 2, 2018

(54) ON-DIE CAPACITOR (ODC) STRUCTURE

(71) Applicant: Altera Corporation, San Jose, CA (US)

(72) Inventors: Kyung Suk Oh, Cupertino, CA (US);
Charu Sardana, San Jose, CA (US);
Yanzhong Xu, Santa Clara, CA (US);
Guang Chen, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/722,000

(22) Filed: May 26, 2015

(65) Prior Publication Data

US 2016/0351654 A1    Dec. 1, 2016

(51) Int. Cl.
| | |
|---|---|
| *H01L 27/00* | (2006.01) |
| *H01L 49/02* | (2006.01) |
| *H01L 23/522* | (2006.01) |
| *H01L 23/528* | (2006.01) |
| *H01L 27/08* | (2006.01) |

(52) U.S. Cl.
CPC .......... *H01L 28/40* (2013.01); *H01L 23/5223* (2013.01); *H01L 23/5286* (2013.01); *H01L 27/0805* (2013.01); *H01L 2924/19041* (2013.01)

(58) Field of Classification Search
CPC .............. H01L 28/40; H01L 23/5223; H01L 2924/19041; H01L 27/0805
See application file for complete search history.

(56) References Cited

U.S. PATENT DOCUMENTS

| | | | |
|---|---|---|---|
| 6,385,033 B1 | 5/2002 | Javanifard | |
| 6,576,977 B1 | 6/2003 | Beeman et al. | |
| 6,706,584 B2 | 3/2004 | List et al. | |
| 7,355,836 B2 | 4/2008 | Radhakrishnan et al. | |
| 7,605,460 B1 | 10/2009 | Wu et al. | |
| 7,705,450 B2 | 4/2010 | Vinson et al. | |
| 7,818,704 B1* | 10/2010 | Oishei | H01G 4/232 326/101 |
| 2005/0068014 A1 | 3/2005 | Dillon et al. | |
| 2007/0209178 A1 | 9/2007 | Savic et al. | |
| 2010/0019347 A1* | 1/2010 | McLellan | H01L 23/5223 257/532 |
| 2012/0250443 A1 | 10/2012 | Saraswat et al. | |
| 2014/0002188 A1* | 1/2014 | Chen | H03F 3/19 330/250 |

(Continued)

*Primary Examiner* — Ngan Ngo
(74) *Attorney, Agent, or Firm* — Tianyi He

(57) ABSTRACT

An on-die-capacitor structure includes a first capacitor and a second capacitor. The first capacitor may have first and second terminals. The first and second terminals are directly connected to first and second power supply rail structures, respectively. The first power supply rail structure is different from the second power supply rail structure. The second capacitor may have third and fourth terminals. The second capacitor is connected in series between the second power supply rail structure and a third power supply rail structure. The third power supply rail structure is different from the first and second power supply rail structures. The third and fourth terminals are directly connected to the second and third power supply rail structures, respectively. The first capacitor may have a first capacitance and the second capacitor structure may have a second capacitance that is greater than the first capacitance.

19 Claims, 4 Drawing Sheets

(56) References Cited

U.S. PATENT DOCUMENTS

| | | | |
|---|---|---|---|
| 2014/0075232 A1* | 3/2014 | Bartling | G06F 13/00 |
| | | | 713/324 |
| 2014/0185367 A1* | 7/2014 | Ngo | G11C 11/419 |
| | | | 365/154 |
| 2014/0367757 A1 | 12/2014 | Jakushokas et al. | |
| 2015/0214150 A1* | 7/2015 | Chang | H01L 23/5256 |
| | | | 257/529 |
| 2015/0348960 A1* | 12/2015 | Gauthier, Jr. | H01L 27/0266 |
| | | | 361/56 |
| 2015/0381057 A1* | 12/2015 | Luu | H02M 7/5387 |
| | | | 363/21.01 |
| 2015/0381157 A1* | 12/2015 | Andreani | H03B 5/12 |
| | | | 331/117 FE |
| 2016/0043633 A1* | 2/2016 | Phadke | H02M 1/4216 |
| | | | 363/21.08 |
| 2016/0149507 A1* | 5/2016 | Lei | H02M 1/12 |
| | | | 363/35 |
| 2016/0179181 A1* | 6/2016 | Doyle | G06F 1/3287 |
| | | | 713/323 |
| 2016/0182021 A1* | 6/2016 | Roine | H03K 3/0315 |
| | | | 331/57 |
| 2016/0197515 A1* | 7/2016 | Wegelin | H02J 1/06 |
| | | | 307/22 |

\* cited by examiner

ON-DIE CAPACITOR (ODC) STRUCTURE

BACKGROUND

Many modern integrated circuit devices include on-die capacitors (ODC). In typical configurations, the ODC is coupled between two power railings, with one power rail being at a higher voltage level than the other power rail. However, high voltage differences between the two power railings can cause reliability concerns, namely due to the breakdown of dielectric material within the ODC.

In some scenarios, the ODC is formed using two or more serially connected capacitors such that each capacitor receives only a portion of the supplied voltage. While such an ODC can overcome the reliability issue, ODCs formed using two or more capacitors can exhibit other non-idealities such as a floating metal plate issue that arises when a metal plate of one of the capacitors is not coupled to any particular voltage or power rail, which causes the metal plate to be at a floating voltage level. The floating metal plate issue is undesirable in most modern integrated circuit devices as floating plates can trap charges and alter the capacitance value of the capacitor.

One typical solution for overcoming the floating metal plate issue is to couple the metal plate to an antenna diode. However, such a solution can increase the number of connections to the on-die capacitors, which may not be preferable and can consume excessive space within the integrated circuit. Another known solution to the floating metal plate issue is to "weakly" couple the floating metal plate to a power rail in which an indirect connection is formed between the floating metal plate and the power rail. However, such a solution can require complex and area-consuming interconnections in order to weakly couple the floating metal plate to the power rail.

It may therefore be desirable to be able to provide improved on-die capacitor structures.

SUMMARY

Embodiments described herein include on-die capacitor structures and a method to manufacture the capacitor structures. It should be appreciated that the embodiments can be implemented in numerous ways, such as a process, an apparatus, a system, a device, or a method. Several embodiments are described below.

In one embodiment, an on-die capacitor structure is described. The on-die-capacitor structure includes a first capacitor and a second capacitor. The first capacitor may have first and second terminals. The first terminal is directly connected to a first power supply rail structure. The second terminal is directly connected to a second power supply rail structure. The first power supply rail structure is different from the second power supply rail structure. The second capacitor may have third and fourth terminals. The second capacitor is connected in series between the second power supply rail structure and a third power supply rail structure. The third power supply rail structure is different from the first and second power supply rail structures. The third terminal is directly connected to the second power supply rail structure and the fourth terminal is directly connected to the third power supply rail structure. In one embodiment, the first capacitor has a first capacitance and the second capacitor structure has a second capacitance that is greater than the first capacitance.

In another embodiment, a method of forming a capacitor structure is described. The method may include a step to form a first capacitor structure and to connect the first capacitor structure directly to first and second power supply rails. In addition to that, the method may also include a step to form a second capacitor structure and to connect the second capacitor structure directly to the second power supply rail and a third power supply rail. In one embodiment, the second power supply rail is interposed between the first and third power supply rails.

Further features of the invention, its nature and various advantages will be more apparent from the accompanying drawings and the following detailed description of the preferred embodiments.

DETAILED DESCRIPTION

The following embodiments describe an on-die capacitor structure and a method to manufacture the capacitor structure. It will be obvious, to one skilled in the art, that the present exemplary embodiments may be practiced without some or all of these specific details. In other instances, well-known operations have not been described in detail in order not to unnecessarily obscure the present embodiments.

Figure 1:
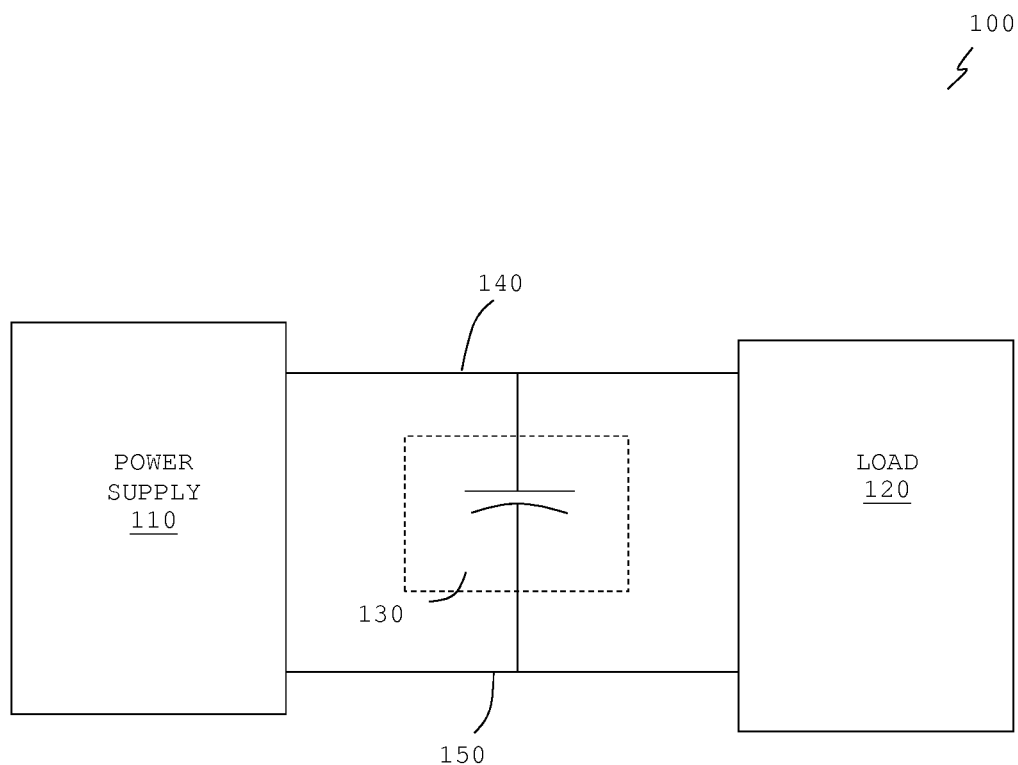
FIG. 1 shows an illustrative circuit with a decoupling capacitor in accordance with an embodiment of the present invention.
Figure 3:
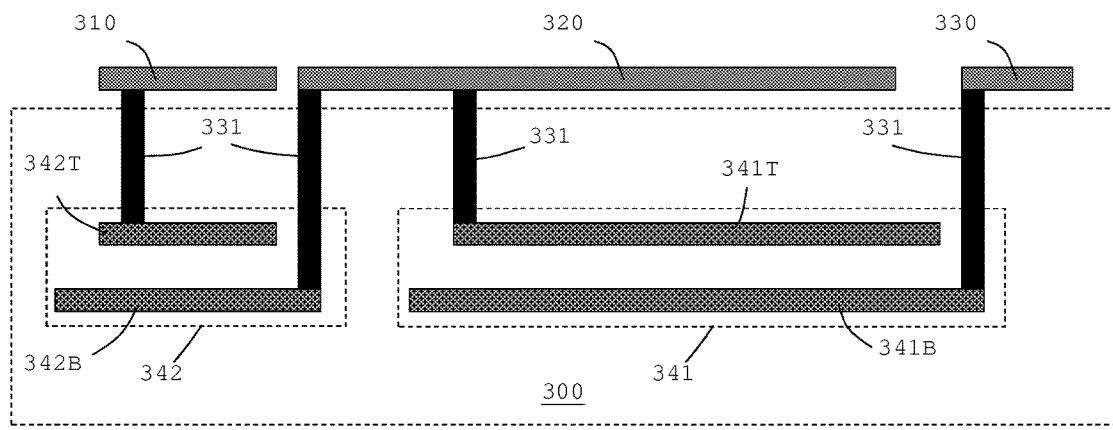
FIG. 3 shows an illustrative on-die capacitor structure in accordance with an embodiment of the present invention.

FIG. 1, meant to be illustrative and not limiting, illustrates a circuit with a decoupling capacitor in accordance with one embodiment of the present invention. As shown in FIG. 1, circuit 100 includes power supply 110, load 120, and decoupling capacitor 130. In one embodiment, decoupling capacitor 130 may be a circuit representation of the physical structure of on-die capacitor 300 as shown in FIG. 3, for example.

Circuit 100 may be implemented in a programmable logic device (PLD) such as a field programmable gate array (FPGA) device, for example. Alternatively, circuit 100 may be an application specific integrated circuit (ASIC) device or application specific standard products (ASSP) device, such as, a memory device or a microprocessor device. It should be appreciated that such integrated circuit devices may include multiple circuits 100.

As shown in the embodiment of FIG. 1, power supply 110 may be coupled to load 120 through two power voltage rails 140 and 150. Decoupling capacitor 130 may be formed between power voltage rails 140 and 150. It should be appreciated that circuit 100 may be formed differently and should not be restricted to the exact arrangement as shown in the embodiment of FIG. 1.

Power supply 110 may be utilized to supply power to load 120. Power supply 110 may, for example, provide a regulated output from an unregulated input voltage. In one embodiment, power supply 110 may be a voltage regulator circuit (VCO). Power supply 110 may be a liner voltage regulator circuit, a switching voltage regulator circuit, a charge pump circuit, or any other desired power supply circuit. A person skilled in the art may select the type of power supply 110 depending on the desired integrated circuit design. In one suitable arrangement, power supply 110 may supply 3.0 volts (V) to load 120.

If desired, power supply 110 may supply regulated voltages through power voltage rails 140 and 150. Power voltage rails 140 and 150 may be wire interconnects or any other desired conductive paths. In an integrated circuit device, power rails 140 and 150 may be formed on metal layers of an integrated circuit die (e.g., metal layers on or within an integrated circuit substrate). In the example where power supply 110 provides 3 V to load 120, supply 110 may provide a voltage level of 3 V on power voltage rail 140 and a voltage level of 0 V on voltage rail 150, for example.

As shown in the embodiment of FIG. 1, load 120 may be coupled to power voltage rails 140 and 150. In one embodiment, load 120 may be any circuit element that requires power within an integrated circuit device. For an FPGA device, load 120 may be logic circuitry. Alternatively, for an ASIC/ASSP device, load 120 may be a specific circuit that performs the function of the ASIC/ASSP device.

Decoupling capacitor 130 may be utilized to decouple a circuit from another circuit. Decoupling capacitor 130 may be coupled in a shunt manner between power voltage rails 140 and 150. In the embodiment of FIG. 1, decoupling capacitor 130 may decouple load 120 from alternating current (AC) signals or voltage spikes that may be transmitted on power voltage rails 140 and 150 together with a direct current (DC) voltage. Any AC signal or voltage spike on power voltage rails 140 may then be transmitted through decoupling capacitor 130 and into power voltage rail 150. Decoupling capacitor 130 may also be referred to as a bypass capacitor, for example.

It should be appreciated that decoupling capacitor 130 may be formed using multiple capacitor structures. In one embodiment, decoupling capacitor 130 may be formed using two serially coupled capacitor structures. When decoupling capacitor 130 is formed using multiple coupled capacitor structures, capacitor 130 may be able to handle large voltage differences between power voltage rails 140 and 150 since the voltage level may be distributed across each of the two serially coupled capacitor structures.

Figure 2:
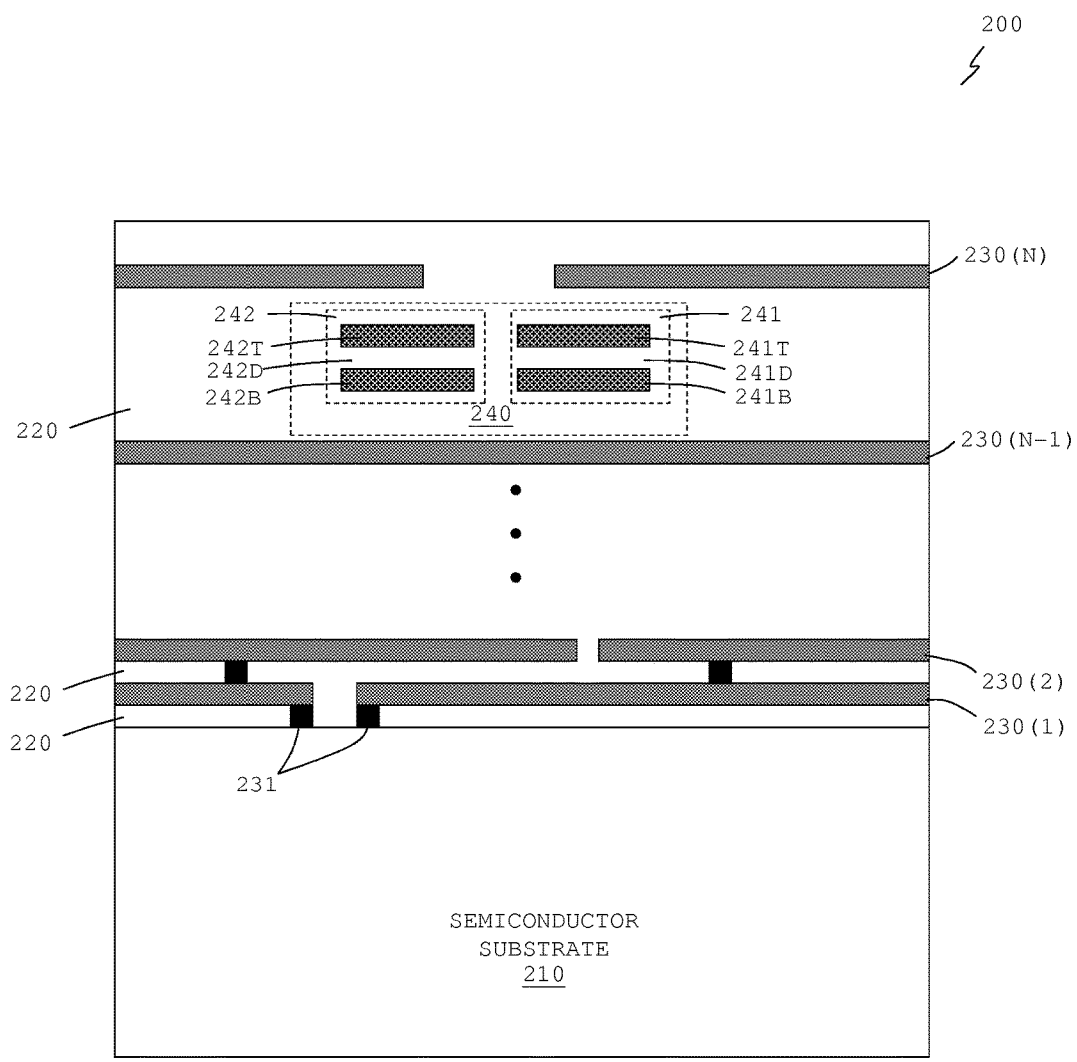
FIG. 2 shows an illustrative cross-sectional view of an integrated circuit that includes a capacitor structure formed between two metal layers in accordance with an embodiment of the present invention.

FIG. 2, meant to be illustrative and not limiting, illustrates a cross-sectional view of an integrated circuit that includes a capacitor structure formed between two metal layers on an integrated circuit in accordance with one embodiment of the present invention. As shown in FIG. 2, integrated circuit 200 includes semiconductor substrate 210, metal layers 230(1)-230(N), dielectric layers 220, and on-die capacitor (ODC) structure 240. On-die capacitor 240 may be similar to decoupling capacitor 130 of FIG. 1, for example.

It should be appreciated that an actual cross section of an integrated circuit may be more complicated (e.g., the integrated circuit may include more layers, structures, etc.) than the cross-sectional view of integrated circuit 200 and specific elements may not be shown in order not to unnecessarily obscure the present invention.

Semiconductor substrate 210 may form a base for an integrated circuit die. In one embodiment, semiconductor substrate 210 may be a silicon substrate. Semiconductor substrate 210 may include multiple active circuits (not shown), such as, p-type metal oxide semiconductor (PMOS) transistors and n-type metal oxide semiconductor (NMOS) transistors. Signals may be transmitted to active circuits in integrated circuit 200 through metal layers 230(1)-230(N) and conductive vias 231. In one embodiment, conductive vias 231 may be through-hole vias (THVs) or micro-vias (μ-vias). Conductive vias 231 may transmit signals (e.g., input/output (I/O) signals or power signals), for example. In a complex integrated circuit die (e.g., an FPGA die) there may be at least ten metal layers. Hence, the value for N may be 10 or greater, for example. In one embodiment, power voltage rails (e.g., power voltage rails 140 and 150 of FIG. 1) may be formed in one or more of the metal layers 230(1)-230(N).

As shown in the embodiment of FIG. 2, every two metal layers 230(1)-230(N) may be separated by a corresponding dielectric layer 220. Dielectric layer 220 may act as an insulator between every two metal layers 230(1)-230(N). In one embodiment, dielectric layers 220 may be low-k dielectric layers (e.g., silicon dioxide) or high-k dielectric layers (e.g., nitride hafnium silicates (HfSiON)).

As shown in the embodiment of FIG. 2, on-die capacitor 240 may be formed between metal layer 230(N−1) and metal layer 230(N). In one embodiment, on-die capacitor 240 may be formed at the upper metal layers (or the metal layers farthest from semiconductor substrate 210). The preference to form on-die capacitor 240 at the upper metal layers is to minimize noise within power voltage rails (as part of good power distribution network design practices). Therefore, for a ten-metal-layer integrated circuit die 200, on-die capacitor 240 may be formed between the ninth metal layer 230(N−1) and the tenth metal layer 230(N) (where N equals 10). The ninth and tenth metal layers 230 may form the power voltage rails for on-die capacitor 240. On-die capacitor 240 may include two capacitor structures (i.e., capacitor structures 241 and 242). Capacitor structure 241 may include dielectric material 241D interposed between capacitor plate 241T and capacitor plate 241B. Similarly, capacitor structure 242 may include dielectric material 242D interposed between plate 242T and plate 242B. In one embodiment, capacitor structures 241 and 242 may be high-density metal-insulator-metal (HD-MiM) capacitors. In an alternative embodiment, capacitor structures 241 and 242 may be metal-insulator-metal (MiM) capacitors or metal-oxide-metal (MOM) capacitors.

FIG. 3, meant to be illustrative and not limiting, illustrates an on-die capacitor structure in accordance with one embodiment of the present invention. On-die capacitor 300 may, for example, be similar to on-die capacitor 240 of FIG. 2. On-die capacitor 300 may include two capacitor structures 341 and 342 (e.g., similar to capacitor structures 241 and 242 of FIG. 2).

As shown in the embodiment of FIG. 3, on-die capacitor 300 is coupled to three power rails 310, 320 and 330 through conductive vias 331. Conductive vias 331 may be similar to conductive vias 231 of FIG. 2. Power rails 310, 320 and 330 may be formed on one of the metal layers 230(1)-230(N) of FIG. 2, in one embodiment. It should be appreciated that power rails 310, 320 and 330 are formed from three separate conductors although they are formed each within a single metal layer. Power rail 310 may be at a voltage level that is higher than power rail 320. In addition, power rail 320 may be at a voltage level that is higher than power rail 330. In one example, power rail 310 may be provided at a voltage level of 3 V, power rail 320 may be at 1.8 V, and power rail 330 may be at a ground voltage level (i.e., 0 V).

Capacitor structures 341 and 342 may be utilized to decouple a power rail at a high voltage (e.g., 3 V) from a load (e.g., load 120 of FIG. 1). In one embodiment, capacitor structure 341 may form a part of on-die capacitor 300, which is utilized to decouple the high voltage power rail (i.e., power rail 310). Capacitor structure 341 is coupled to a VCCPD voltage level power rail (i.e., power rail 320) and ground voltage level power rail (i.e., power rail 330).

In one embodiment, the size (e.g., lateral area, capacitance, etc.) of capacitor structure 341 may be at least four times larger than the size of capacitor structure 342. For example, capacitor structure 341 may exhibit a capacitance greater than 15 nanoFarad (nF) whereas capacitor structure 342 may exhibit a capacitance greater than 0.8 nF. Capacitance for on-die capacitor 300 may be greater than 3 nF, for example.

Capacitor structure 342 may include capacitor plate 342T and capacitor plate 342B. Plate 342T is directly connected to power rail 310 whereas plate 342B is directly connected to power rail 320 (e.g., vias 331 may form two terminals of the capacitor that are directly connected to power rails 310 and 320 without any intervening metal layers coupled between the power rails and the capacitor plates). Capacitor structure 341 may include plate 341T and plate 341B. Plate 341T is directly connected to power rail 320 whereas plate 341B is directly connected to power rail 330 (e.g., vias 331 may form two terminals of the capacitor structure that are directly connected to power rails 320 and 330 without any intervening metal layers coupled between the power rails and the capacitor plates). In one embodiment, capacitor structures 341 and 342 are connected in series through power rail 320 (i.e., through plate 341B and top plate 342T). It should be appreciated that the term "directly connected" as described herein may refer to metal traces or power rails that are formed in metal layers adjacent to where on-die capacitor 300 may be formed.

As shown in the embodiment of FIG. 3, plates 341T and 342T are shorter in length compared to plates 341B and 342B, respectively. This is because only a sufficient length of plates 341B and 342B may be able to facilitate coupling with conductive via 331. However, the effective length required for the purpose of capacitance may only be as long as the plates 341T and 342T for capacitor structures 341 and 342, respectively.

Plates 341T, 341B, 342T and 342B may include conductive materials. It should be appreciated that plates 341T, 341B, 342T and 342B may also be referred to as capacitor conductors. In one embodiment, plates 341T, 341B, 342T and 342B may include aluminum-silicon alloy, aluminum-copper alloy, aluminum-titanium-copper alloy, aluminum alloy, titanium nitride, molybdenum, or copper.

It should be appreciated that dielectric may exist between plate 342T and plate 342B for capacitor structure 342 and plate 341T and plate 341B for capacitor structure 341. Materials that form the dielectric may be similar to materials that form dielectric layer 220 of FIG. 2. In one embodiment, materials forming the dielectric may be low-k dielectric (e.g., silicon dioxide) or a high-k dielectric (e.g., nitride hafnium silicates (HfSiON)). Alternatively, the material forming the dielectric may be Zirconium oxide, hafnium oxide, aluminum oxide, tantalum oxide, or silicon dioxide.

Figure 4:
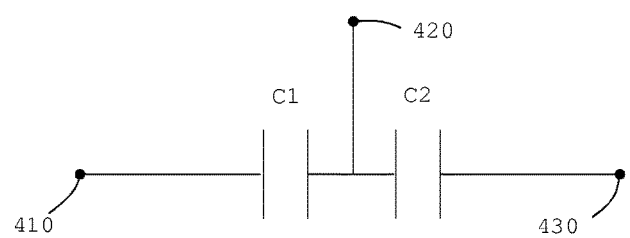
FIG. 4 shows an illustrative circuit representation of an on-die capacitor of the type shown in FIG. 3 in accordance with an embodiment of the present invention.

FIG. 4, meant to be illustrative and not limiting, illustrates a circuit representation of on-die capacitor of FIG. 3 in accordance with one embodiment of the present invention. The capacitors C1 and C2 represent capacitor structures 341 and 342 of FIG. 3, respectively. Terminals 410, 420 and 430 may be coupled to different power rails. For example, terminal 410 may be directly connected to a high voltage power rail (e.g., a portion of a corresponding via 331 may form capacitor terminal 410 and may be directly connected to a high voltage power rail without any intervening metal layers), terminal 430 may be directly connected to a low/ground voltage power rail, and terminal 420 may be directly connected to a power rail that is at a voltage level somewhere between high and low/ground voltage power rail. In one embodiment, terminal 410 may be directly connected to power rail 310 of FIG. 3, terminal 420 may be directly connected to power rail 320 of FIG. 3, and terminal 430 may be directly connected to power rail 330 of FIG. 3 (e.g., without any intervening metal layers on the semiconductor substrate between the capacitor plate and the corresponding power rail).

As shown in the embodiment of FIG. 4, capacitors C1 and C2 are coupled in series. Hence, the received high voltage levels may be distributed across capacitors C1 and C2. Therefore, such an arrangement may resolve the reliability concern that generally arises in a high voltage decoupling capacitor. In one embodiment, the high voltage may be a voltage level that is more than 3 V. When the high voltage is 3 V, a portion of the high voltage may be distributed across capacitor C1 (e.g., 1.2 V) and another portion of the high voltage may be distributed across capacitor C2 (e.g., 1.8 V).

Figure 5:
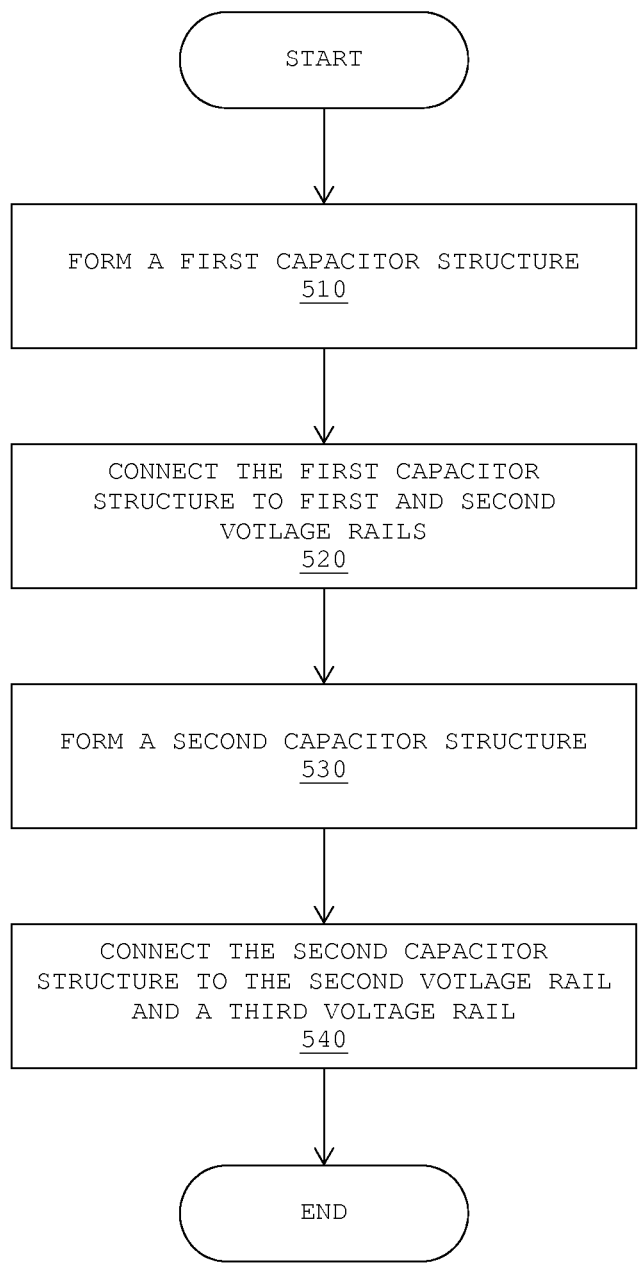
FIG. 5 shows an illustrative flowchart of a method to manufacture an on-die capacitor of the type described in connection with FIGS. 1-4 in accordance with an embodiment of the present invention.

FIG. 5, meant to be illustrative and not limiting, illustrates a flowchart of a method for manufacturing an on-die capacitor in accordance with one embodiment of the present invention. The on-die capacitor may be similar to on-die capacitor 240 of FIG. 2 or on-die capacitor 300 of FIG. 3.

At step 510, a first capacitor structure is formed. The first capacitor structure may be similar to capacitor structure 242 of FIG. 2 or capacitor structure 342 of FIG. 3. The first capacitor structure may be formed within a dielectric layer (e.g., dielectric layer 220 of FIG. 2). In one embodiment, the first capacitor structure may be an HD-MiM capacitor. It should be appreciated that steps include to form the first capacitor structure may include: (i) forming a bottom metal plate (e.g., plate 242B of FIG. 2 or plate 342B of FIG. 3), (ii) forming dielectric material on top of the bottom metal plate, and (iii) forming a top metal plate above the dielectric material (e.g., plate 242T of FIG. 2 or plate 342T of FIG. 3).

At step 520, the first capacitor structure is directly connected to first and second voltage rails. The first and second voltage rails are coupled to different metal plates of the first capacitor structure. In one embodiment, the first voltage rail is coupled to the top metal plate of the first capacitor structure and the second voltage rail is coupled to the bottom metal plate of the first capacitor structure. The first and second voltage rails may be similar to power railings 310 and 320, respectively, of FIG. 3. The first voltage rail may be at a voltage level that is higher than the second voltage rail. In one exemplary embodiment, the first voltage rail may be at a voltage level of 3 V and the second voltage rail may be at a voltage level of 1.8 V. Conductive vias may be formed to connect the first and second voltage rails to the first capacitor structure. In one embodiment, the conductive vias may be similar to conductive vias 231 of FIG. 2 or conductive vias 331 of FIG. 3.

At step 530, a second capacitor structure is formed. The second capacitor structure may be similar to capacitor structure 241 of FIG. 2 or capacitor structure 341 of FIG. 3. Similar to the first capacitor structure, the second capacitor structure may be formed within a dielectric layer (e.g., dielectric layer 220 of FIG. 2). The second capacitor structure may be similar to an HD-MiM capacitor. It should be appreciated that the steps to form the second capacitor structure may also include the three steps (i)-(iii) that are utilized to form the first capacitor structure. As shown in the embodiment of FIGS. 2 and 3, the second capacitor structure may be formed adjacent to the first capacitor structure, or alternatively in a dielectric layer that also includes the first capacitor structure.

At step 540, the second capacitor structure is directly connected to the second voltage rail and a third voltage rail. Similar to the first capacitor structure, the second and third voltage rails are coupled to different metal plates of the second capacitor structure. In one embodiment, the second voltage rail is coupled to the top metal plate of the second capacitor structure and the third voltage rail is coupled to the bottom metal plate of the second capacitor structure. The third voltage rail may be similar to power railing 330 of FIG. 3. The third voltage rail may be at a voltage level that is lower than the voltage levels of the first and second voltage rails. In one exemplary embodiment, the voltage level for the third voltage rail is a ground voltage level (i.e., 0 V). The second and third voltage rails may be coupled to the second capacitor structure through conductive vias (e.g., conductive vias 231 of FIG. 2 or conductive vias 331 of FIG. 3). The on-die capacitor formed may have the first and second capacitors formed or coupled in series. Therefore, the received voltage may be distributed across the first capacitor structure and the second capacitor structure. Such an on-die capacitor may overcome reliability issues that may arise when it is utilized to decouple a high voltage rail (e.g., a 3V power railing) from a load.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. Apparatus, comprising:
a first capacitor having first and second terminals, wherein the first terminal is directly connected to a first power supply rail structure and the second terminal is directly connected to a second power supply rail structure via a first conductive structure and wherein the second power supply rail structure is different from the first power supply rail structure;
a second capacitor having third and fourth terminals, wherein the second capacitor is connected between the second power supply rail structure and a third power supply rail structure that is different from the first and second power supply rail structures, wherein the third terminal is directly connected to the second power supply rail structure via a second conductive structure and the fourth terminal is directly connected to the third power supply rail structure, and wherein the first conductive structure is separate from the second conductive structure; and
power supply circuitry, wherein the power supply circuitry directly supplies a first voltage level to the first power supply rail structure and a second voltage level to the second power supply rail structure.

2. The apparatus defined in claim 1, wherein the power supply circuitry supplies a third voltage level to the third power supply rail structure that is less than the second voltage level.

3. The apparatus defined in claim 2, wherein the power supply circuitry supplies the first voltage level at 3 volts, the second voltage level at 1.8 volts and the third voltage level at a ground voltage level.

4. The apparatus defined in claim 1, wherein the second power supply rail structure is interposed between the first and third power supply rail structures.

5. The apparatus defined in claim 4, wherein the first, second, and third power supply rail structures are each formed from separate conductors in a common layer of a semiconductor substrate.

6. The apparatus defined in claim 1, wherein the first and second capacitors comprise high-density MIM capacitors.

7. The apparatus defined in claim 1, wherein the first capacitor has a first capacitance value and the second capacitor has a second capacitance value that is greater than the first capacitance value.

8. An on-die capacitor structure, comprising:
a first voltage rail;
a second voltage rail;
a first capacitor structure connected in series between the first and second voltage rails, wherein the first capacitor structure includes first and second conductive plates, wherein the first conductive plate is directly connected to the first voltage rail and the second conductive plate is directly connected to the second voltage rail; and
a second capacitor structure that is different from the first capacitor structure, wherein the second voltage rail is connected in series between the first capacitor structure and the second capacitor structure, wherein the second capacitor structure includes third and fourth conductive plates, wherein the third conductive plate is directly connected to the second voltage rail and the fourth conductive plate is directly connected to a third voltage rail, wherein the second conductive plate is formed separately from the third conductive plate, and wherein the first capacitor structure has a first capacitance, and the second capacitor structure has a second capacitance that is greater than the first capacitance.

9. The on-die capacitor structure defined in claim 8, wherein the first capacitor structure further includes
a dielectric layer formed between the first and second conductive plates, wherein the dielectric layer is formed between the third and fourth conductive plates.

10. The on-die capacitor structure defined in claim 9, wherein the first voltage rail is supplied with a first voltage level, the second voltage rail is supplied with a second voltage level that is less than the first voltage level, and the third voltage rail is supplied with a third voltage level that is less than the second voltage level.

11. The on-die capacitor structure defined in claim 10, wherein the first and second capacitor structures are selected from a group of capacitor structures consisting of: metal-insulator-metal (MiM) capacitor structures, high-density MIM capacitor structures, and metal-oxide-metal (MOM) capacitor structures.

12. The on-die capacitor structure defined in claim 9, wherein the second capacitance is at least four times greater than the first capacitance.

13. The on-die capacitor structure defined in claim 9, wherein the first and second capacitor structures are formed between two metal layers of a semiconductor die.

14. A method of forming a capacitor structure, comprising:
forming a first capacitor structure that includes a top plate and a bottom plate;
connecting the first capacitor structure directly to first and second power supply rails by forming a conductive structure that directly connects the bottom plate of the first capacitor structure to the second power supply rail;
forming a second capacitor structure that includes an additional top plate and an additional bottom plate; and
connecting the second capacitor structure directly to the second power supply rail and a third power supply rail by forming an additional conductive structure that directly connects the additional top plate of the second capacitor structure to the top plate of the second capacitor, wherein the second power supply rail is interposed between the first and third power supply rails and wherein the conductive structure is parallel to the additional conductive structure.

15. The method defined in claim 14, further comprising:
coupling the first power supply rail to a first voltage source;
coupling the second power supply rail to a second voltage source; and
coupling the third power supply rail to a third voltage source, wherein the first voltage source generates a power signal at a first voltage level, wherein the second voltage source generates a power signal at a second voltage level that is less than the first voltage level, and wherein the third voltage source generates a power signal at a third voltage level that is less than the second voltage level.

16. The method defined in claim 14, embedding the first and second capacitor structures within a dielectric layer and interposing the dielectric layer between two metal layers of an integrated circuit die.

17. The method as defined in claim 14, wherein the first and second capacitor structures are selected from a group of capacitor structures consisting of: metal-insulator-metal (MiM) capacitor structures, high-density MIM capacitor structures and metal-oxide-metal (MOM) capacitor structures.

18. The method defined in claim 14, wherein the second capacitor structure has a capacitance value that is at least four times greater than a capacitance value of the first capacitor structure.

19. The on-die capacitor structure defined in claim 8, wherein the second capacitor structure is connected in series between the second voltage rail and a third voltage rail, wherein the first voltage rail is provided with a positive supply voltage, wherein the third voltage rail is provided with a ground voltage, and wherein the second voltage rail is provided with an intermediate voltage that is greater than the ground voltage and less than the positive supply voltage.

\* \* \* \* \*